United States Patent [19]

Gardner et al.

[11] Patent Number: 5,754,447
[45] Date of Patent: May 19, 1998

[54] PROCESS FOR PREDICTING STRUCTURAL PERFORMANCE OF MECHANICAL SYSTEMS

[75] Inventors: David R. Gardner; Bruce A. Hendrickson; Steven J. Plimpton, all of Albuquerque; Stephen W. Attaway, Cedar Crest; Martin W. Heinstein; Courtenay T. Vaughan, both of Albuquerque, all of N. Mex.

[73] Assignee: Sandia National Laboratories, Albuquerque, N. Mex.

[21] Appl. No.: 741,074

[22] Filed: Oct. 30, 1996

[51] Int. Cl.⁶ .................................................. G06G 7/68
[52] U.S. Cl. .................... 364/508; 364/512; 364/578
[58] Field of Search .................................. 364/507, 508, 364/512, 578

[56] References Cited

U.S. PATENT DOCUMENTS

| | | | |
|---|---|---|---|
| 4,742,473 | 5/1988 | Shugar et al. | 364/578 |
| 4,819,161 | 4/1989 | Konno et al. | 364/578 |
| 4,858,146 | 8/1989 | Shebini | 364/512 |
| 4,933,889 | 6/1990 | Meshkat et al. | 364/578 |
| 5,029,119 | 7/1991 | Konno | 364/578 |
| 5,043,929 | 8/1991 | Kramer et al. | 364/578 |
| 5,327,358 | 7/1994 | Stubbs | 364/507 |
| 5,402,366 | 3/1995 | Kilhara et al. | 364/578 |
| 5,442,569 | 8/1995 | Osano | 364/578 |
| 5,479,824 | 1/1996 | Torres | 365/507 |
| 5,493,511 | 2/1996 | Wincheski et al. | 364/508 |
| 5,594,651 | 1/1997 | St. Ville | 364/512 |

OTHER PUBLICATIONS

*Paragon System User's Guide*, Intel Corporation, Beaverton, OR (Apr. 1996).

"PRONTO-3D: A Three-Dimensional Solid Dynamics Program," Taylor and Flanagan, SAND87-1912, Sandia National Laboratories, Mar. 1989.

"A Partitioning Strategy for Nonuniform Problems on Multiprocessors," M.J.Berger and Bokhari, IEEE Trans. On Computers, vol. C-36, No. 5, May 1987, pp. 570–580.

"A New Parallel Algorithm for Contact Detection in Finite Element Methods," Hendrickson, Plimpton, Attaway, Vaughan, Gardner, Proceedings of the High Performance Computing '96 Conference, Apr. 1996, pp. 170–176.

*Primary Examiner*—James P. Trammell
*Assistant Examiner*—Eric W. Stamber

[57] ABSTRACT

A process for predicting the structural performance of a mechanical system represents the mechanical system by a plurality of surface elements. The surface elements are grouped according to their location in the volume occupied by the mechanical system so that contacts between surface elements can be efficiently located. The process is well suited for efficient practice on multiprocessor computers.

13 Claims, 8 Drawing Sheets

PROCESS FOR PREDICTING STRUCTURAL PERFORMANCE OF MECHANICAL SYSTEMS

This invention was made with Government support under Contract DE-AC0494AL85000 awarded by the U.S. Department of Energy. The Government has certain rights in the invention.

BACKGROUND OF THE INVENTION

This invention relates generally to the field of predicting structural performance of mechanical systems, and more specifically to processes amenable to multiprocessor computers for locating surface contacts that affect structural performance.

Processes using Lagrangian finite elements are widely used for predicting the structural performance of mechanical systems (e.g., impact damage to shipping containers or vehicles). Present processes are not suited to efficient practice on multiprocessor computers because the present processes do not load balance well on multiprocessor computers. A finite element mesh representing the mechanical system is typically partitioned on the multiprocessor so that each processing unit owns a localized region of the finite element mesh. This mesh partitioning is optimal for finite element determinations of stress, strain, and force because each processing unit only needs to communicate with neighboring processing units. However, contacts can occur between finite elements owned by any two processing units (e.g., as metal crumples during impact). Accordingly, present processes require a search across all the processing units for contact between surfaces. The search does not make efficient use of multiprocessor resources, and does not provide substantially equal work for all the processing units in the multiprocessor.

The inefficient location of contacts has limited the application of present processes for predicting the structural performance of mechanical systems. A process better suited to multiprocessor application is needed to predict the structural performance of more complex mechanical systems.

SUMMARY OF THE INVENTION

The present invention provides a process for predicting the structural performance of a mechanical system. The invention provides an improved process for locating surface contacts in the mechanical system. The improved process is more efficient than present processes, and is well suited for use on multiprocessor computers.

The present invention represents the surfaces of the mechanical system as a plurality of surface elements. Each surface element represents a surface of the mechanical system that will not contact itself. Together, the surface elements represent all the surfaces in the mechanical system. If the mechanical system shears or otherwise creates additional surfaces, then additional surface elements can be added to represent the new surfaces.

The present invention determines the velocity of each surface element from the forces acting upon it for a selected time interval, ignoring the effects of surface contacts. Small time intervals can increase the accuracy of the prediction. The velocities can be determined by a variety of processes, including, for example, finite element modeling. After the velocities are determined, the resulting positions of the surface elements are compared to determine if any surface element will contact any other surface element. If so, then the present invention imposes forces on the surface elements so that they will not pass through each other. The resulting forces are added to those used for determining the surface element velocities for the next time interval.

The present invention groups the surface elements according to their position in the volume occupied by the mechanical system. Because each surface element moves only a limited distance in each time interval, the process can check for contacts only with surface elements in the same or neighboring groups. After each time interval, the surface elements can be re-divided to keep the groups substantially the same in size and to keep surface elements grouped by their current position in the volume. For mechanical systems with many surface elements, the present invention can dramatically reduce the complexity of the search for surface elements contacts. This reduction in complexity can provide faster predictions when implemented on a multiprocessor computer.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

The present invention provides an improved process for predicting the structural performance of a mechanical system. The improved process groups surface elements, representative of the surfaces in the mechanical system, so that a search for contacts is less complex and more efficient than required in present processes.

Figure 1A:
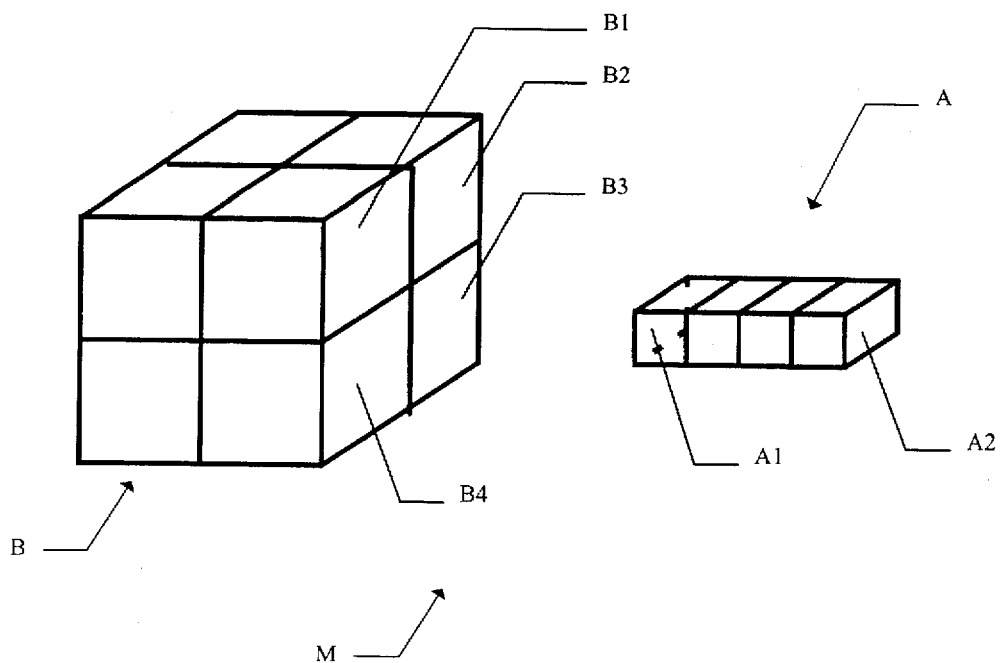
FIG. 1(a–c) is a timed sequence illustrating two blocks coming into contact.
Figure 1B:
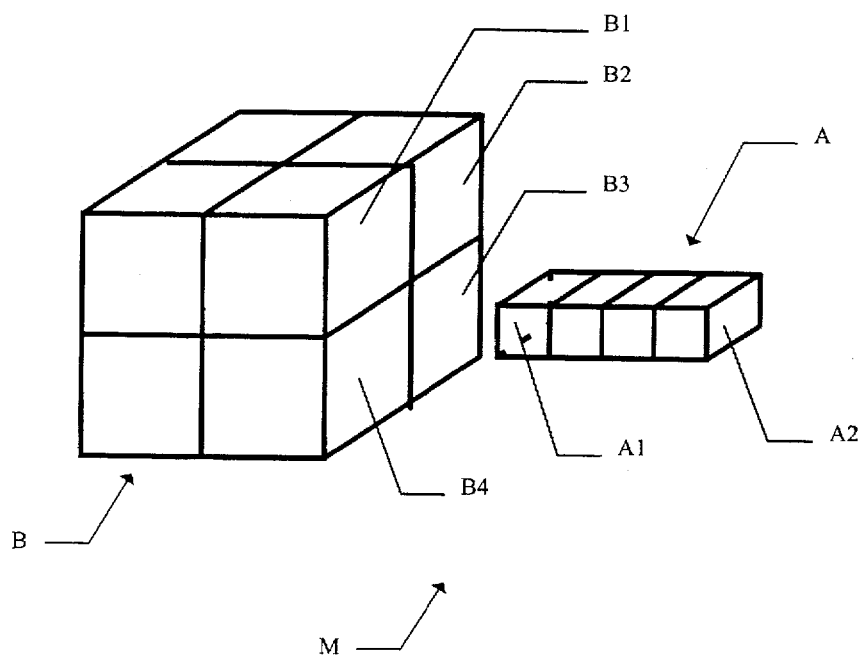
Figure 1C:
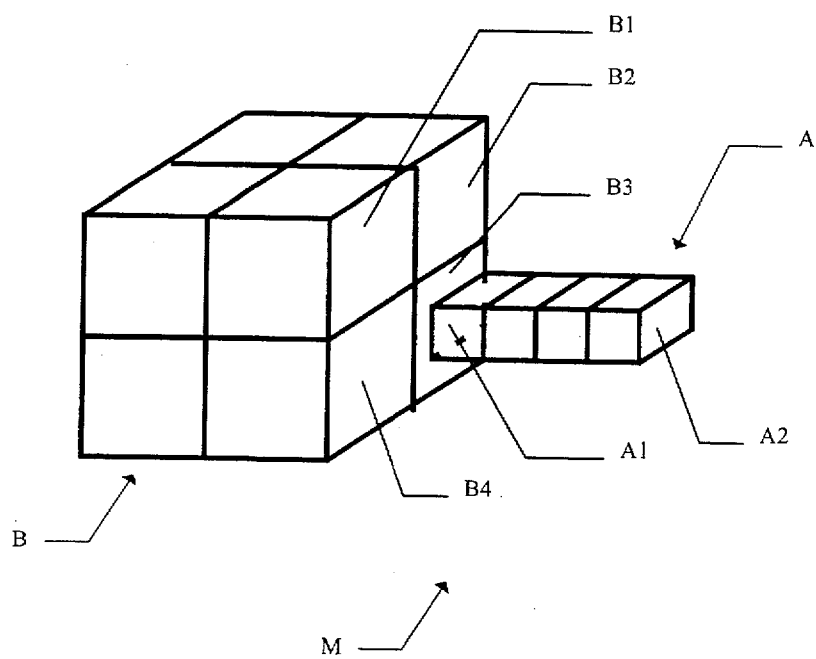

A mechanical system M, depicted in FIG. 1(a–c), comprises two blocks A, B. At an initial time $t_0$, in FIG. 1a, the two blocks A, B are separated from each other. The surface of each block A, B is divided into a plurality of surface elements such as surface elements A1, A2, B1, B2, B3, etc. Block A is moving toward block B. FIG. 1b shows the same blocks A, B at a first time $t_1$, after the initial time $t_0$. Block A is about to contact Block B. FIG. 1c shows the two blocks at a second time $t_2$, after the first time $t_1$. Block B contacts Block A and applies force thereto. Any process predicting the performance of the mechanical system M must compare the locations of surface elements to check for contacts. In FIG. 1c, surface element A1 contacts surface element B3. Such process predicting the mechanical system's M performance can impose forces on the two blocks A, B to prevent the surface elements A1, B3 from passing through each other. The imposed forces can be used to predict the blocks' A, B further performance by processes such as finite element modeling.

In the mechanical system M shown in FIG. 1, a small number of surface elements are to be checked for contact.

More complex mechanical systems can require many more surface elements to accurately predict their performance. Checking for contacts by exhaustively searching all possible pairs of surface elements can be prohibitively expensive and time consuming. The present invention provides an improved process for grouping surface elements so that the search for contacts is efficient.

Figure 2A:
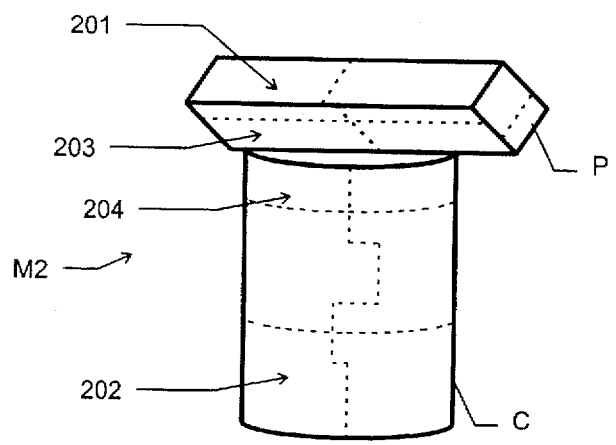
FIG. 2(a–c) is a timed sequence illustrating a cylinder being deformed by a moving plate with surface element grouping according to the present invention.

FIG. 2(a-c) shows a mechanical system comprising a cylinder C and a plate P. Initially, shown in FIG. 2a, the cylinder C and the plate P are just in contact. The plate P is moving toward the cylinder C. Every surface in the mechanical system M2 is divided into a plurality of surface elements. Each surface element represents a portion of a surface small enough that it will not contact itself. A process according to the present invention divides the mechanical system into regions, where each region represents a contiguous portion of the mechanical system and where all the regions contain substantially the same number of surface elements. The surface elements are grouped so that all the surface elements in a region belong to the same group. Accordingly, surface elements near the top left of the figure belong to one group 201, while surface elements near the bottom left belong to another 202. The number of regions is dependent on the particularities of the mechanical system and on the apparatus used to practice the invention; for a multiprocessor computer the number of regions can be equal to the number of processing units. After a specified time interval, each surface element is checked for contact with every surface element in its region. If the surface element moved out of the region, then the surface element is checked for contact with surface elements in the region corresponding to the surface element's new position. As long as the time interval and surface element velocities do not permit surface elements to travel farther than one region per time interval the search for contacts does not need to consider surface elements in other regions. For large number of regions, considerable reduction in the time required to locate surface element contacts can result.

In FIG. 2a the plate P and the cylinder C have just come into contact. Surface elements on the bottom of the plate P contact surface elements on the top of the cylinder C. For each surface element contact, a force is applied so that the surfaces will not pass through each other. The forces are then used to predict the performance of the material of the plate P and the cylinder C for the next time interval.

Figure 2B:
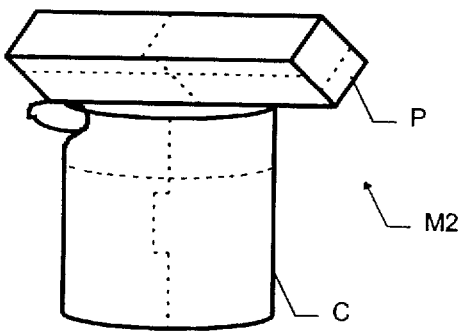
Figure 2C:
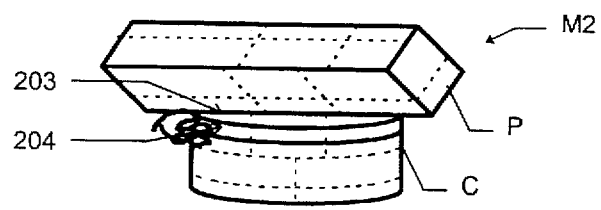

In FIG. 2b the plate P has crushed the cylinder C. The system in FIG. 2c is the system of FIG. 2b after many time intervals. The location of contacts and application of suitable forces, and prediction of the material response to the forces are repeated at each time interval.

In FIG. 2b the surface elements have moved significantly from their original locations. Accordingly, the division into regions is different. Some of the surface elements 203, 204 that were originally in different regions are now in the same region since they have moved closer together as the prediction process proceeds. Because the subdivision into regions changes as the surface elements move, the search for contacts can still be limited even though surface elements have moved.

In FIG. 2c the plate P has more completely crushed the cylinder C after many more time intervals. The surface element grouping is different from that in FIG. 2b since the surface elements have changed position in the volume. The surface elements are still grouped according to their position, however, so the search for contacts is still efficient.

The surface elements can be grouped by considering each element's location in the volume occupied by the mechanical system. A first region is formed that includes all the surface elements. The first region can be divided into two sub-regions, each having substantially the same number of elements. The division is made along a plane through the first region. All the surface elements in a sub-region are assigned to the same initial group. The two sub-regions can then be divided into new sub-regions by different planes extending through the region of the volume associated with the group, and the surface elements assigned to new groups based on the new sub-regions.

Figure 3A:
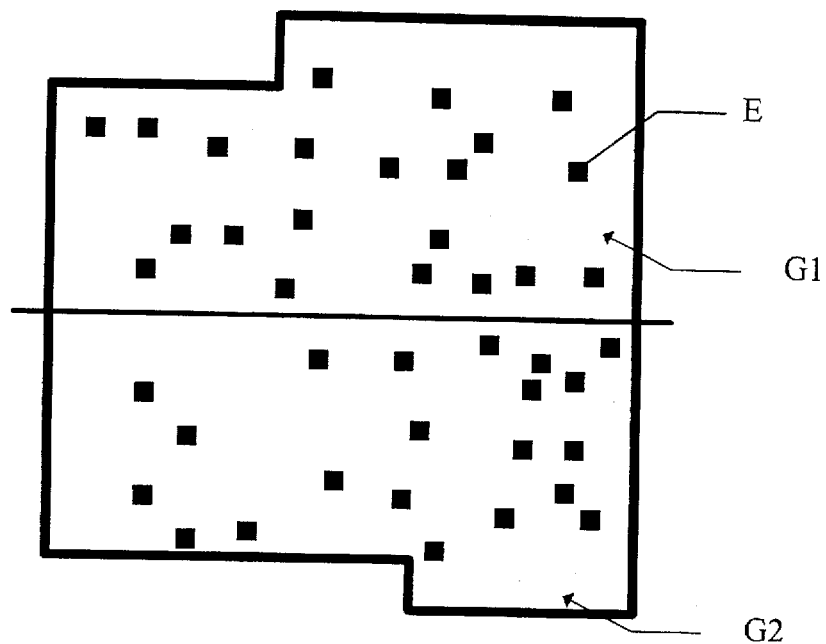
FIG. 3(a–c) is a graphical depiction of surface element grouping according to the present invention.
Figure 3B:
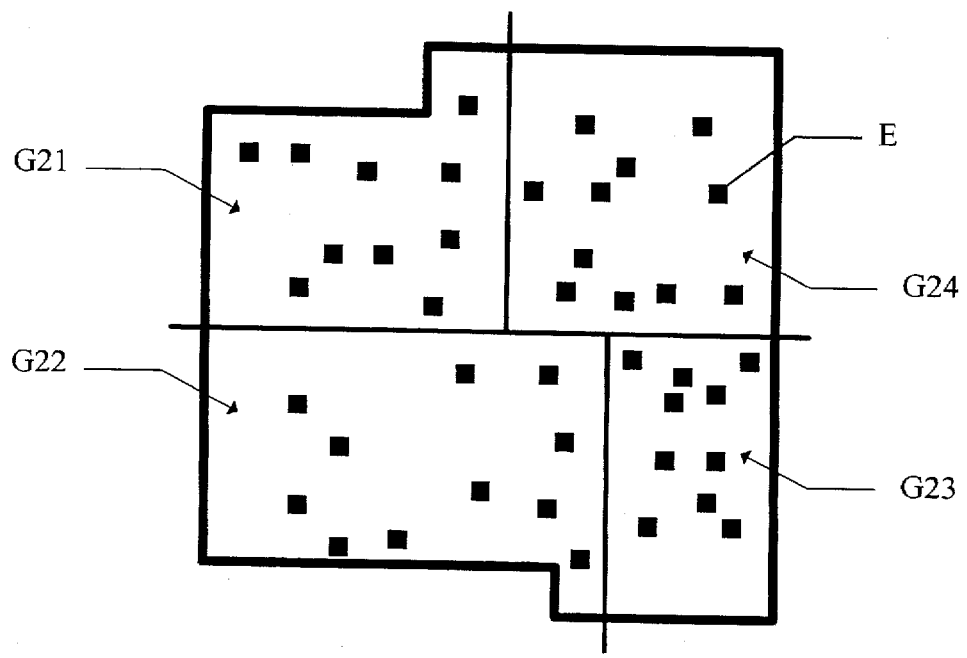
Figure 3C:
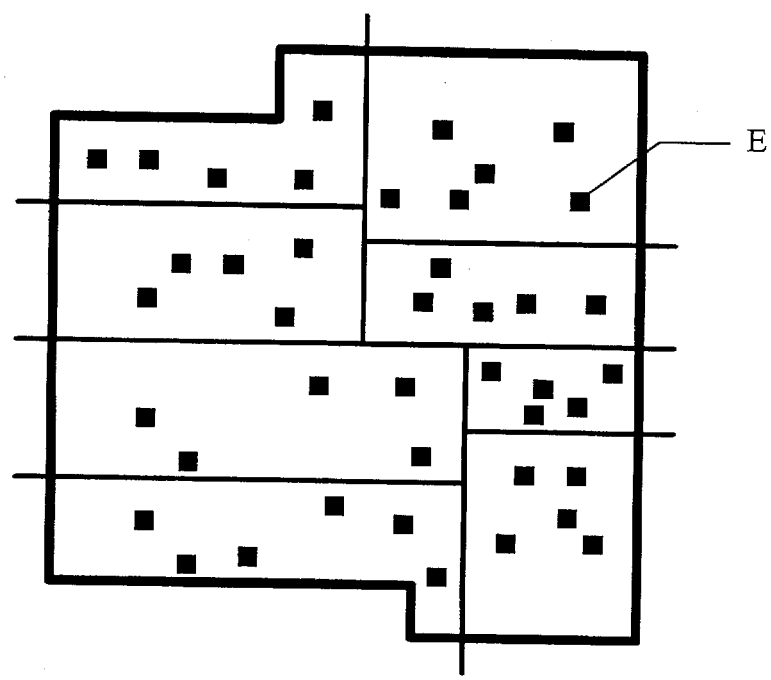

FIG. 3(a-c) shows several steps of this process using a two dimensional representation of the volume and lines for the planes of region division. The figure represents surface elements and their locations by points in the plane such as point E. In FIG. 3a the first group G1 of surface elements is divided into two groups G11, G12 by a line. In FIG. 3b each of the two groups G11, G12 is divided by new lines, dividing the groups G11, G12 into four new, substantially equal groups G21, G22, G23, G24. FIG. 3c shows the result of further dividing the groups of FIG. 3b. The resultant division has substantially the same number of surface elements in each region, and each group of surface elements contains all the surface elements from the same region of the volume. The search for contacts therefore can include only surface elements in the current or neighboring regions.

Forces are applied to the contacting surface elements to prevent their overlap or penetration. The applied forces are used in the next time interval in the prediction of forces and velocities. Because each surface element can move only a finite distance in one time interval, the surface element grouping from the last time interval is close to the surface element grouping required for the current time interval. Small adjustments in the grouping can be more efficient when practicing the process on a multiprocessor computer.

The present invention can be practiced using a multiprocessor computer such as the Intel Paragon as described in *Paragon System User's Guide*, Intel Corporation, Beaverton, Oreg. (April 1996), incorporated herein by reference. "A Paragon system can have up to more than 2000 nodes. Some nodes are equipped with a SCSI interface, Ethernet interface, or other I/O connection. These nodes manage the system's disk and tape drives, network connections, and other I/O facilities. Nodes with I/O interfaces communicate with the other nodes over the node interconnect network. However, this access is transparent: processes on nodes without I/O hardware can access the I/O facilities using standard OSF/1 system calls, just as though they were directly connected. Nodes with I/O interfaces are otherwise identical to nodes without I/O interfaces, and can run user processes." The prediction of forces and velocities for each time interval can be accomplished with a Lagrangian finite element program. A suitable program is described by Taylor and Flanagan in "PRONTO-3D: A Three-Dimensional Solid Dynamics Program," SAND87-1912, Sandia National Laboratories, incorporated herein by reference. A mechanical system is first represented by a plurality of material elements and surface elements and by models for the materials in the mechanical system.

Figure 4:
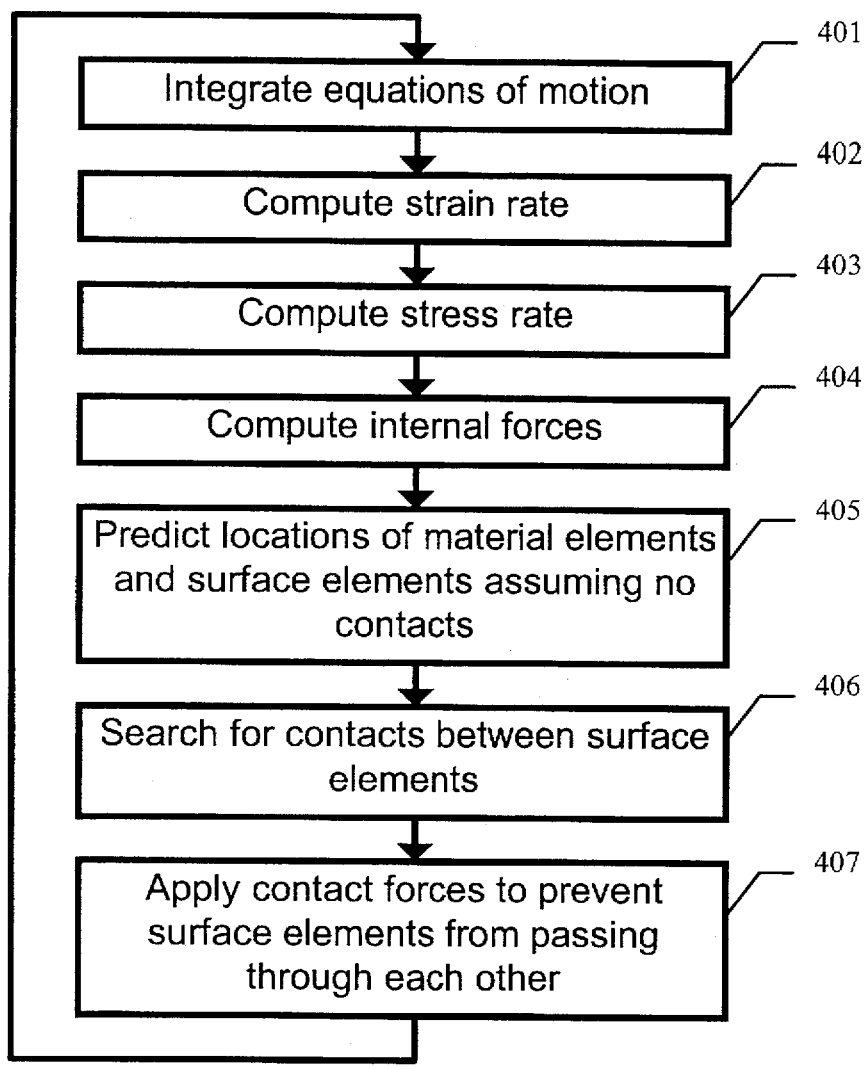
FIG. 4 is a flow diagram of a performance prediction process according to the present invention.

FIG. 4 shows the flow of operations for prediction of the mechanical system's performance after a time interval. The equations of motion are integrated for the material elements and surface elements 401. The strain rate can then be computed based on the motion of the material elements 402. The stress rate can then be computed based on the strain rate and the material models 403. From these the internal forces acting on the material elements can be computed 404. From the internal forces, the accelerations of the material elements and surface elements can be computed. From the accelerations and the time interval the locations of the surface elements after the time interval can be predicted 405. The predicted locations of the surface elements can then be checked for contacts 406. For each contact, forces can be applied to the corresponding surface elements and material elements to prevent the surface elements from passing through each other 407. Those skilled in the art will appreciate that variations on the above sequence are possible. The predicted locations of the surface elements can be displayed at selected times, or can be recorded for subsequent use.

Figure 5:
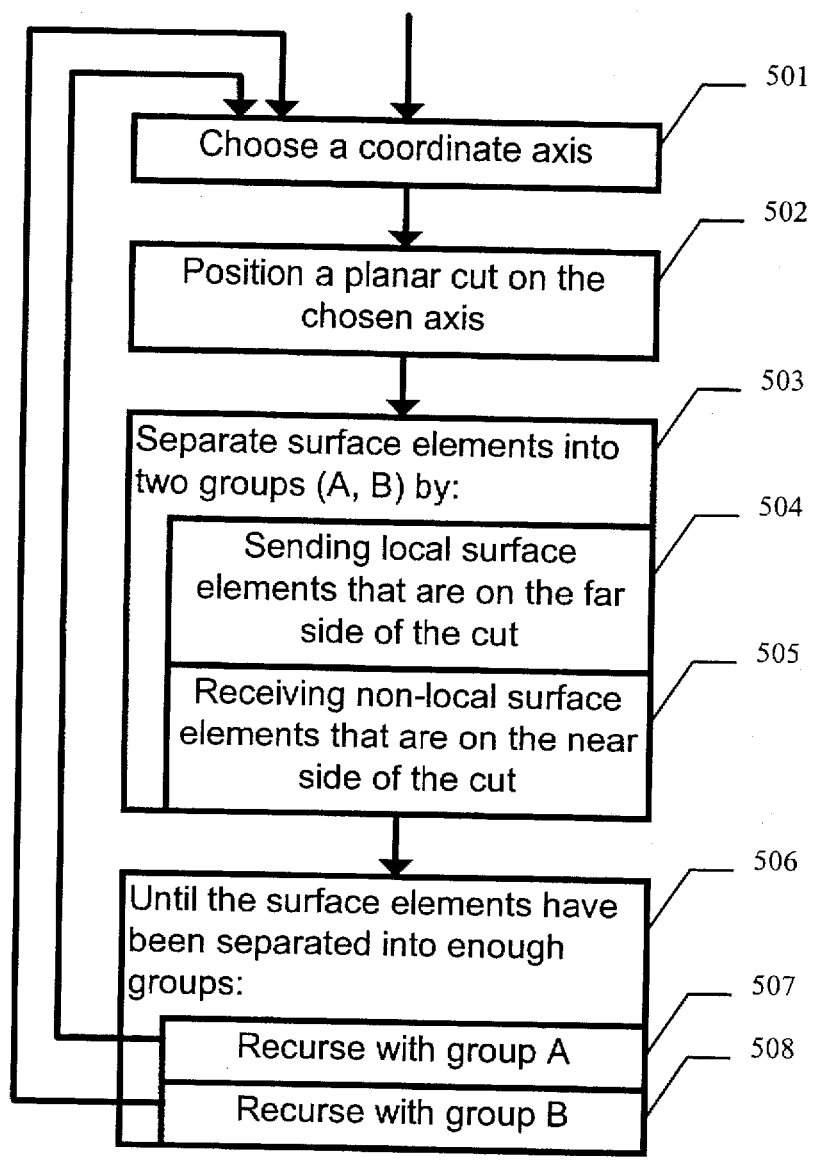
FIG. 5 is a flow diagram of a surface element grouping process according to the present invention.

The search for potential contacts can be accomplished with a surface element grouping process as described above. One efficient process for dynamically regrouping the surface elements is recursive coordinate bisectioning (RCB), as described by M. J. Berger and Bokhari in "A Partitioning Strategy for Nonuniform Problems on Multiprocessors," IEEE Trans. Computers, C-36, pages 570–580 (1987), incorporated herein by reference. One pass through the grouping process can involve the steps shown in FIG. 5. An axis through the volume can be chosen 501. Then, a plane or other surface can be positioned on the axis to divide the volume into two parts 502. Each side of the division can have corresponding processing units. Each processing unit can have information about surface elements. The surface elements can then be divided into two groups by sending surface element information to processing units corresponding to the side of the division where each surface element resides 503. This can be done by sending surface element information for each surface element that currently resides locally but is located on the far side of the division to processing units corresponding to the far side of the division 504, and receiving information about surface elements that currently reside on processing units corresponding to the far side of the division but that lie on the near side of the division 505. If the surface elements have been divided into enough groups, then the grouping process can stop 506. If not, then grouping process can continue, for example, by recursing through the process with each subgroup result from the previous grouping 507, 508. The number of surface element groups can be chosen to maximize load balance, minimize communication costs, maximize search efficiency, or some other characteristics of the process. Grouping the surface elements after one time interval of movement can begin with the groupings from the previous time interval. Surface element information does not need to be sent unless new group boundaries and surface element movement have changed the surface element to group to processing unit correspondence. Relatively slow surface element movement and short time intervals can therefore reduce the amount of communication required for surface element grouping.

Figure 6:
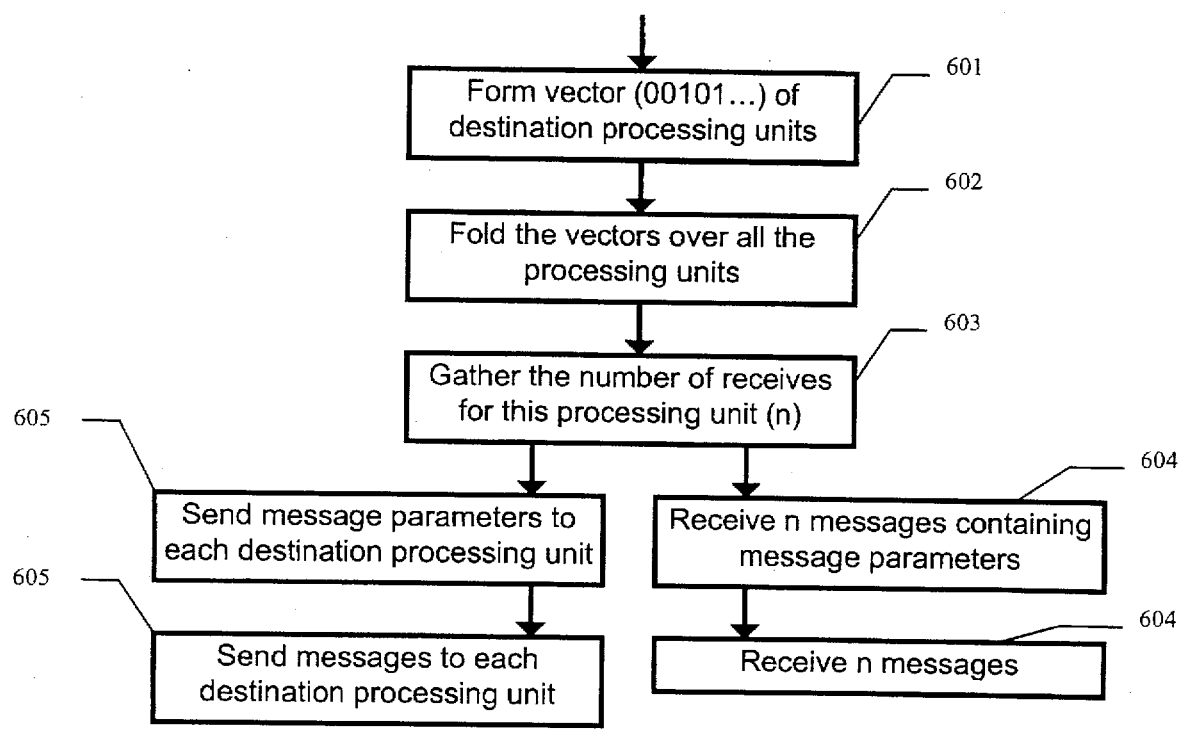
FIG. 6 is a flow diagram of a process for unstructured communication according to the present invention.

Practicing the invention on an Intel Paragon multiprocessor requires unstructured communication. For example, the communication of surface elements after division into groups requires unstructured communication. Unstructured communication required to practice the invention can be implemented as shown in FIG. 6. Each processing unit determines which other processing units it must send information to, called a destination processing unit. A vector of 0s and 1s is formed with a 1 at each vector index corresponding to a destination process and 0s at all other vector indices 601. The vector can then be folded over all the processing units, generating an efficient summation of all the vectors 602. The number of receives required at each processing unit can be determined from the number in the corresponding vector index. Each processing unit can then initiate the appropriate number of receives to receive short messages defining the message parameters of the full messages 603. Each processing unit can also send short messages defining the parameters required for the full message to each destination processing unit 605. After the message parameters are received, each processing unit can initiate the appropriate receives for the full messages 604, and can send the full messages 605. Those skilled in the art will appreciate that other messaging processes might be used with other performance objectives or other multiprocessor computer systems.

A specific embodiment of the present invention using an Intel Paragon multiprocessor is described in "A New Parallel Algorithm for Contact Detection in Finite Element Methods," Hendrickson, Plimpton, Attaway, Vaughan, Gardner, Proceedings of the High Performance Computing '96 Conference (New Orleans, April 8–11, 1996, pp. 170–6), incorporated herein by reference.

The particular sizes and equipment discussed above are cited merely to illustrate particular embodiments of the invention. It is intended that the scope of the invention be defined by the claims appended hereto.

We claim:

1. An apparatus for predicting the structural performance of a mechanical system, where the mechanical system comprises one or more physical objects having surfaces and occupying a multidimensional space, said apparatus comprising:

a) a plurality of processing units, where each processing unit comprises storage means for storing information and communication means for communicating information with other processing units;

b) mesh means for representing the object surfaces as a plurality of surface elements with related characteristic information, where each surface element represents a portion of an object surface that will not contact itself;

c) mapping means for dividing the plurality of surface elements into a plurality of groups, where each group contains all the surface elements in a contiguous region of the multidimensional space, and uniquely assigning each group to a processing unit;

d) structural prediction means for predicting the structural performance of the mechanical system as expressed by the velocities of the surface elements after a selected time interval; and e) wherein each processing unit further comprises:

i) means for checking for contact between surface elements belonging to the group assigned to the processing unit;

ii) means for checking for contacts between surface elements belonging to groups corresponding to neighboring regions in the multidimensional space;

iii) means for communicating characteristic information of surface elements that move out of the group assigned to a processing unit to the processing unit assigned the group to which the surface elements moved;

iv) means for applying forces to the surface elements so that no surface element passes through another surface element;

v) means for communicating the forces to the structural prediction means; and vi) means for dividing the surface elements into new groups, where each group comprises all the surface elements within a contiguous region of the multidimensional space and where the groups contain substantially equal numbers of surface elements.

2. A process for using a computer to predict the structural performance of a mechanical system occupying a multidimensional space and having surfaces, where each surface has an initial position and an initial velocity in the multidimensional space, said process comprising:

a) representing the mechanical system's surfaces as a plurality of surface elements, where each surface element represents a portion of the mechanical system's surfaces;

b) dividing the mechanical system into a plurality of regions, where each region represents a contiguous portion of the multidimensional space and the regions together represent the whole multidimensional space, and wherein each region contains substantially the same number of surface elements;

c) predicting the current velocity and current position of each surface element after a time interval;

d) checking for surface elements that contact other surface elements in the same region;

e) checking for surface elements that contact other surface elements in neighboring regions;

f) for any surface elements that contact other surface elements, applying forces so that the surface elements will not penetrate the other surface elements;

g) repeating steps b through f until a desired terminal condition is reached; and h) predicting the structural performance of the mechanical system by displaying the positions of the surface elements predicted in step c) at selected times.

3. The process of claim 2, additionally comprising the step of representing the mechanical system as a plurality of material elements where each surface element has a corresponding material element, and wherein the material elements have associated material characteristics, and wherein the step of predicting the current velocity comprises:

c1) integrating equations of motion for the material elements and surface elements;

c2) computing the strain rate based on the motion of the material elements;

c3) computing the stress rate based on the strain rate of the material elements and the material characteristics of the material elements;

c4) computing internal forces acting on the material elements; and c5) computing the current velocity of each surface element from the internal forces acting on the material elements in a selected time interval.

4. The process of claim 3, wherein the computer comprises multiple processing units, additionally comprising the step of assigning material elements to processing units, and wherein the step of displaying the positions of the surface elements comprises sending the position of each surface element predicted in step c) to the processing unit assigned the corresponding material element.

5. The process of claim 2, wherein the step of dividing the mechanical system into regions comprises:

b1) defining a plane through the multidimensional space that separates the multidimensional space into first and second multidimensional spaces, where the number of surface elements in the first multidimensional space is substantially the same as the number of surface elements in the second multidimensional space;

b2) repeating step b1) starting with the first multidimensional space and repeating step a starting with the second multidimensional space until the multidimensional space has been divided into a number of multidimensional spaces equal to the desired number of regions; and b3) assigning a region to each multidimensional space.

6. The process of claim 2, wherein each surface element is described by corresponding characteristic information, and wherein the computer comprises multiple processing units, and wherein the step of dividing the mechanical system into a plurality of regions further comprises the steps of:

b1) assigning each region to a corresponding processing unit, and b2) sending the characteristic information for each surface element in each region to the corresponding processing unit.

7. A process for using a multiprocessor computer to predict the structural performance of a mechanical system having surfaces and occupying a multidimensional space, comprising the steps of:

a) partitioning the mechanical system into a plurality of material elements;

b) partitioning the surfaces of the mechanical system into a plurality of surface elements with associated surface element information, where each surface element has a corresponding material element;

c) assigning material elements to processing units so that substantially equal number of material elements are assigned to each processing unit;

d) integrating equations of motion for the material elements and the surface elements;

e) computing the strain rate based on the motion of the material elements;

f) computing the stress rate based on the strain rate of the material elements and the material characteristics of the material elements;

g) computing internal forces acting on the material elements;

h) computing the current velocity and position of each surface element from the internal forces acting on the corresponding material element in a selected time interval;

i) assigning the surface elements to processing units so that substantially equal numbers of surface elements are assigned to each processing unit and so that all the surface elements in a contiguous region of the multidimensional space are assigned to the same processing unit;

j) locating contacts between surface elements assigned to each processing unit;

k) locating contacts between surface elements assigned to one processing unit and surface elements assigned to other processing units;

l) for each contact, applying forces to prevent the surfaces from penetrating each other;

m) repeating steps d through l until a desired terminal condition is reached; and n) predicting the performance of the mechanical system by recording the positions of the surface elements computed in step h).

8. The process of claim 7, wherein the step of assigning surface elements to processing units comprises:

i1) defining a plane through the multidimensional space that separates the multidimensional space into first and second contiguous multidimensional subspaces, where the number of surface elements in the first multidimensional space is substantially the same as the number of surface elements in the second multidimensional space;

i2) repeating step i1) starting with the first multidimensional subspace and repeating step a starting with the second multidimensional subspace until the multidimensional space has been divided to form a number of multidimensional subspaces substantially equal to the number of processing units to be assigned surface elements;

i3) assigning one multidimensional subspace to each processing unit, and assigning all the surface elements in the assigned multidimensional subspace to that processing unit; and i4) sending surface element information to the processing unit assigned the multidimensional subspace containing the surface element for each surface element whose information is not currently with the processing unit assigned the multidimensional subspace containing the surface element.

9. A process for using a multiprocessor computer system to predict the structural performance of a mechanical system occupying a multidimensional space and having surfaces, where each surface has an initial position and an initial velocity in the multidimensional space, said process comprising:

a) inputting a model of the mechanical system into the computer system;

b) representing the surfaces of the model of the mechanical system as a plurality of surface elements, where each surface element represents a portion of the mechanical system's surfaces;

c) dividing the model of the mechanical system into a plurality of regions, where each region represents a contiguous portion of the multidimensional space and the regions together represent the whole multidimensional space, and wherein each region contains substantially the same number of surface elements;

d) predicting the current velocity and current position of each surface element after a time interval;

e) checking for surface elements that contact other surface elements in the same region;

f) checking for surface elements that contact other surface elements in neighboring regions;

g) for any surface elements that contact other surface elements, applying forces so that the surface elements will not penetrate the other surface elements;

h) repeating steps b) through f) until a desired terminal condition is reached; and i) predicting the performance of the mechanical system by displaying the positions of the surface elements predicted in step d) at selected times.

10. The process of claim 9, additionally comprising the step of representing the model of the mechanical system as a plurality of material elements where each surface element has a corresponding material element, and wherein the material elements have associated material characteristics, and wherein the step of predicting the current velocity comprises:

a) integrating the equations of motion for the material elements and surface elements;

b) computing the strain rate based on the motion of the material elements;

c) computing the stress rate based on the strain rate of the material elements and the material characteristics of the material elements;

d) computing internal forces acting on the material elements; and e) computing the current velocity of each surface element from the internal forces acting on the material elements and from the selected time interval.

11. The process of claim 10, wherein the computer system comprises multiple processing units, additionally comprising the step of assigning material elements to processing units, and wherein the step of displaying the predicted positions of the surface elements comprises sending the predicted position of each surface element to the processing unit assigned the corresponding material element.

12. The process of claim 9, wherein the step of dividing the model of the mechanical system into regions comprises:

i) defining a plane through the multidimensional space that separates the multidimensional space into first and second multidimensional spaces, where the number of surface elements in the first multidimensional space is substantially the same as the number of surface elements in the second multidimensional space;

ii) repeating step i) starting with the first multidimensional space and repeating step a starting with the second multidimensional space until the multidimensional space has been divided into a number of multidimensional spaces equal to the desired number of regions; and iii) assigning a region to each multidimensional space.

13. The process of claim 9, wherein each surface element is described by corresponding characteristic information, and wherein the computer system comprises multiple processing units, and wherein the step of dividing the model of the mechanical system into a plurality of regions further comprises the steps of:

i) assigning each region to a corresponding processing unit, and ii) sending the characteristic information for each surface element in each region to the corresponding processing unit.

* * * * *